United States Patent [19]

Seevinck

[11] Patent Number: 4,599,578
[45] Date of Patent: Jul. 8, 1986

[54] PROTECTION CIRCUIT

[75] Inventor: Evert Seevinck, Delden, Netherlands

[73] Assignee: U.S. Philips Corporation, New York, N.Y.

[21] Appl. No.: 622,045

[22] Filed: Jun. 19, 1984

[30] Foreign Application Priority Data

Jun. 21, 1983 [NL] Netherlands ................ 8302197

[51] Int. Cl.⁴ .................... H03F 3/04; H02H 7/20
[52] U.S. Cl. .................... 330/298; 330/288; 361/79
[58] Field of Search ............ 330/288, 207 P, 298; 361/79, 87, 90, 93

[56] References Cited

U.S. PATENT DOCUMENTS 4,355,341 10/1982 Kaplan ................. 330/298 X

OTHER PUBLICATIONS

*Phillips Data-Handbook: Integrated Circuits,* "20 W Hi-Fi Audio Power Amplifier", Jan. 1983.

Primary Examiner—James B. Mullins
Attorney, Agent, or Firm—William J. Streeter; Marianne R. Rich

[57] ABSTRACT

To protect a transistor its emitter current is converted by a resistor into a voltage which by means of a voltage-current converter is converted into a current which is proportional to the emitter current. The collector-emitter voltage is converted by means of a voltage-current converter into a current which is proportional to the difference between a knee voltage which is applied to the converter, and the collector-emitter voltage, the converter not producing an output current for collector-emitter voltages exceeding the knee voltage. The difference between the output currents of the converters is compared with the current carried by a current source. The protection circuit becomes operative when this difference current exceeds the current carried by the current source. A control amplifier then drives the transistor in such manner that the difference current becomes equal to the current. Above the knee voltage a residual current which has a value proportional to the current carried by the current source continues to flow through the transistor $T_1$. As a result thereof the value of the residual current depends to a lesser extent on variations, which reduces the risk of damage to the transistor due to overloading at high collector-emitter voltages.

3 Claims, 5 Drawing Figures

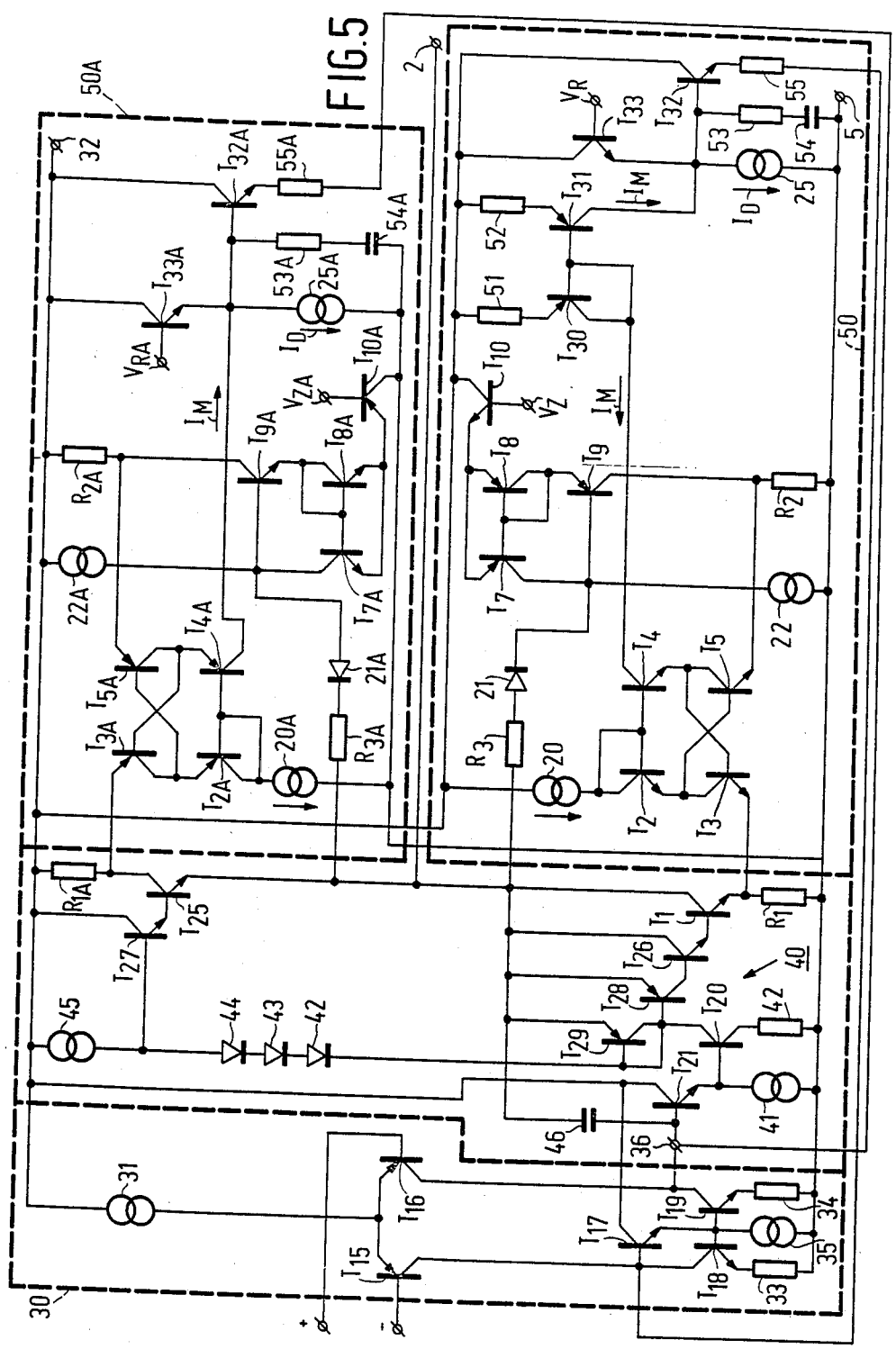

PROTECTION CIRCUIT

BACKGROUND OF THE INVENTION

1. Field of the Invention

The invention relates to a protection circuit for protecting a transistor from overloading. Such a protection circuit can, for example, be used in integrated power amplifiers for audio equipment. The output transistors of such power amplifiers must be operated within the Safe Operating Area Rating (SOAR) to prevent the transistors from being damaged by overloading.

2. Description of the Prior Art

Such a protection circuit is, for example, used in the integrated audio amplifier TDA 1520, described in Philips Data-Handbook: Integrated Circuits, January 1983. Therein, the first means comprises a first part resistor included in the collector or the emitter lead of the transistor. A first signal is derived from the voltage across this resistor, which signal consequently is proportional to the current through the transistor. The second means comprise a voltage divider formed by second and third resistors and arranged between the collector and the emitter of the transistor. A second signal is derived from the voltage across the second resistor, which second signal is consequently proportional to the collector-emitter voltage of the transistor. Above a given collector-emitter voltage, the what is referred to as knee voltage, the voltage across the second resistor is limited by a Zener diode arranged in parallel therewith, so that the second signal has a constant value above the knee voltage.

The first and second signals are added together whereafter this sum signal is compared with a threshold value. If the sum signal becomes greater than the threshold value, then a transistor is rendered conductive which diverts base current from the output transistor and consequently limits the current through the output transistor.

From the fact that when the protection becomes operative the sum of the first and second signals is controlled in such manner that this sum is equal to the threshold value, it follows that the limited value of the current through the output transistor is equal to the difference between a fixed current which is proportional to the threshold value and a variable current which is proportional to the collector-emitter voltage of the transistor.

With very small collector-emitter voltages the second signal is so small as to be disregarded. In that case the protection becomes operative if the first signal, which is proportional to the collector current, becomes greater than the threshold value. The implication is that the maximum current through the output transistor is proportional to the threshold value.

Since the voltage across the second resistor is limited by the Zener diode, a small residual current may continue to flow through the output transistor in the event of collector-emitter voltages above the knee voltage. This residual current is necessary to ensure that the circuit can operate correctly upon application of the supply voltage, as the load, for example a loudspeaker, is coupled to the output of the output transistor via a capacitor. Upon switch-on a certain current is required to charge this capacitor. The residual current is also required to prevent distortion of the output signal in the event of a large voltage swing. This residual current is equal to the difference between the maximum current through the transistor, which is proportional to the threshold value, and a fixed current which is proportional to the knee voltage.

Now the residual current is much smaller, for example by a factor of 20, than the maximum current through the output transistor. Consequently, the residual current is formed by the difference between two currents which are each much larger than the residual current itself, in the present example 20 and 19 times larger, respectively. As a result thereof, the residual current is highly dependent on variations in these currents. A variation of, for example, 5% in one of the currents causes a variation of 100% in the residual current. Precisely in the area above the knee voltage with high collector-emitter voltages an excessive residual current may easily result in the output transistor being damaged. Too small a residual current has for its result that the output signal is distorted in the event of a large voltage swing or that the circuit cannot build-up to proper operation upon application of the supply voltage.

SUMMARY OF THE INVENTION

It is therefore an object of the invention to provide a protection circuit with which an improved protection at high collector-emitter voltages is obtained in a circuit in which are present:
- first means for generating a first signal which is a measure of the collector current of the transistor,
- second means for generating a second signal corresponding to the collector-emitter voltage of the transistor, said second signal having a constant value (knee voltage) above a given collector-emitter voltage; and
- third means for limiting the collector current of the transistor if a combination of said first and second second signals exceeds a predetermined threshold value.

In the protection circuit according to the invention:
- the second signal is a measure of the difference between the knee voltage and the collector-emitter voltage, and
- the combination of the first and second signals is formed by the difference between the first and second signals.

The invention is based on the recognition that when the protection becomes operative the current through the output transistor need not be controlled in such manner that it becomes equal to the difference between a fixed current and a variable current which depends on the collector-emitter voltage, but can be made equal to the sum of a fixed current and a variable current which depends on the collector-emitter voltage, it being a requirement that this variable current becomes equal to zero above the knee voltage. Then the residual current through the output transistor is equal to a fixed current, which is variation-dependent to a much lesser extent. This is realised by using the measures according to the invention. The second signal is equal to zero above the knee voltage. When the protection becomes operative at collector-emitter voltages above the knee voltage, the first signal is controlled in such manner that it becomes equal to the threshold value, so that the residual current is proportional to the threshold value.

Such a protection circuit may be further characterized in that the first means comprise a first resistor included in the collector or the emitter lead of the transistor and a first voltage-current converter converting the voltage across the first resistor into a current proportional thereto, that the second means comprise a second voltage-current converter converting the difference between the collector-emitter voltage and the knee voltage into a current proportional thereto and that the third means comprise a control amplifier which so limits the current through the transistor that the difference between the output currents of the first and second voltage-current converters is equal to a threshold current carried by a current source.

BRIEF DESCRIPTION OF THE DRAWING

The invention will now be described in greater detail, by way of example, with reference to the accompanying drawings in which FIG. 5 shows an amplifier circuit comprising protection circuits according to the invention.

DESCRIPTION OF THE PREFERRED EMBODIMENT

Figure 1:
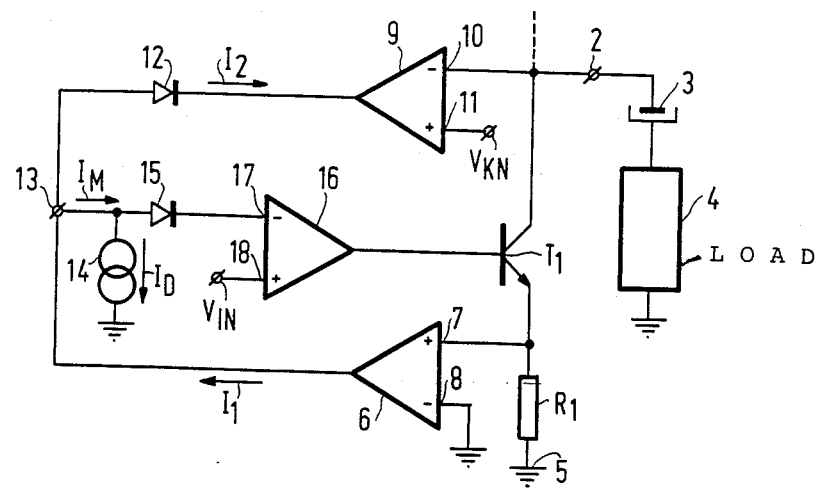
FIG. 1 shows the basic circuit diagram of an example of a protection circuit according to the invention.

FIG. 1 shows the basic circuit diagram of an example of a protection circuit according to the invention. The output transistor $T_1$ to be protected is connected by means of its collector to the output 2 of the circuit to which a load impedance 4 is coupled via a capacitor 3. The emitter of transistor $T_1$ is connected to the negative supply terminal 5, in this case ground, via a resistor $R_1$. The resistor $R_1$ has a very small resistance value of, for example, 0.03 Ohm, which can be constituted by the wire connection between the emitter of transistor $T_1$ and the supply terminal 5. The transistor $T_1$ must be operated within the so-called SOAR to prevent the transistor $T_1$ from being damaged by overloading due to an excessively high current, either in combination or not in combination with an excessively high voltage. In order to ensure operation within the SOAR-range the circuit must be protected. To that end the emitter current $I_E$ of transistor $T_1$ is converted by resistor $R_1$ into a voltage which is applied to the non-inverting input 7 of a voltage-current converter 6, whose inverting input 8 is connected to ground. The output current $I_1$ of the voltage-current converter 6 is therefore $I_1 = aI_E$, a being a constant which is determined by the transconductance of the V/I-converter 6 and the resistance value of resistor $R_1$.

The collector-emitter voltage $V_{CE}$ of transistor $T_1$ is applied to the inverting input 10 of a voltage-current converter 9. The non-inverting input 11 of this V/I-converter 9 carries a constant voltage $V_{KN}$, the so-called knee voltage. The output current $I_2$ of the V/I-converter 9 is therefore equal to $I_2 = b(V_{KN} - V_{CE})$, b being a constant determined by the transconductance of the V/I-converter 9. A diode 12 which is cut-off at the instant at which the output current reverses, that is to say at the instant at which the collector-emitter voltage $V_{CE}$ becomes larger than the knee voltage $V_{KN}$, is included in the output lead of the V/I-converter 9. Consequently, the V/I-converter 9 does not produce an output current for collector-emitter voltages $V_{CE}$ larger than the knee voltage $V_{KN}$.

The output leads of the V/I-converters 6 and 9 are connected to a common point 13, which is coupled to a current source 14 carrying a current $I_D$ and are further connected via a diode 15 to the inverting input 17 of a control amplifier 16, whose non-inverting input 18 carries a drive signal for the output transistor $T_1$. The output of the amplifier 16 is coupled to the base of the output transistor $T_1$. The direction of the output current $I_2$ of the V/I-converter 9 is opposite to that of $I_1$ from the V/I-converter 6, so that the difference $I_M = I_1 - I_2$ between these output currents is available at the point 13. This current $I_M$ is now compared with the current $I_D$ carried by the current source 14. If the current $I_M$ is smaller than the current $I_D$ then the protection is not operative. The difference between the currents $I_M$ and $I_D$ is then supplied by current supply means, not shown for the sake of simplicity, which are switched off as soon as the protection circuit becomes operative. The protection circuit becomes operative when the current $I_M$ becomes larger than the current $I_D$. The difference between these currents then flows through the inverting input 17 of the control amplifier 16. This control amplifier 16 now controls the output transistor $T_1$ in such manner that the current $I_M$ becomes equal to the current $I_D$. In that case it holds that:

$$I_D = aI_E - b(V_{KN} - V_{CE}) \text{ for } V_{CE} < V_{KN} \quad (1a)$$

$$I_D = aI_E \text{ for } V_{CE} \geq V_{KN} \quad (1b)$$

From this it follows for the current $I_E$ as a function of the collector-emitter voltage $V_{CE}$ that:

$$I_E = \frac{I_D}{a} + \frac{b}{a}(V_{KN} - V_{CE}) \text{ for } V_{CE} < V_{KN} \quad (2a)$$

$$I_E = \frac{I_D}{a} \text{ for } V_{CE} \geq V_{KN} \quad (2b)$$

Figure 2:
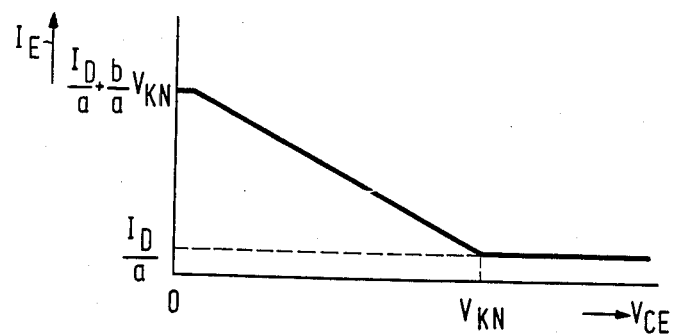
FIG. 2 shows the collector current-collector-emitter voltage characteristic of the protection circuit of FIG. 1.

FIG. 2 shows the $I_E/V_{CE}$ characteristic determined by formulae 2a and 2b. For a very small $V_{CE}$ the current is limited to the maximum current $$I_E \max = \frac{I_D}{a} + \frac{b}{a} V_{KN}.$$

The limit value of the current $I_E$ decreases linearly for increasing $V_{CE}$. Above the knee voltage $V_{KN}$ a small residual current which is defined by formula 2b continues to flow through transistor $T_1$. This residual current ensures that the circuit is capable of supplying the current required for the quiescent setting when the supply is switched on. For that purpose it is inter alia necessary that upon switch on of the supply voltage a small current flows to charge the capacitor 3 (see FIG. 1). A small residual current must also flow to prevent, in the event of a large voltage swing, distortion which would otherwise occur because of the fact that the transistor $T_1$ becomes currentless. The residual current is no longer formed, as in the prior art protection circuit, by the difference between two comparatively large currents but is directly determined by the threshold current $I_D$. The magnitude of the residual current depends therefore to a much lesser extent on variations, so that the probability that the output transistor $T_1$ is damaged by overloading at high collector-emitter voltages is significantly reduced.

Figure 3:
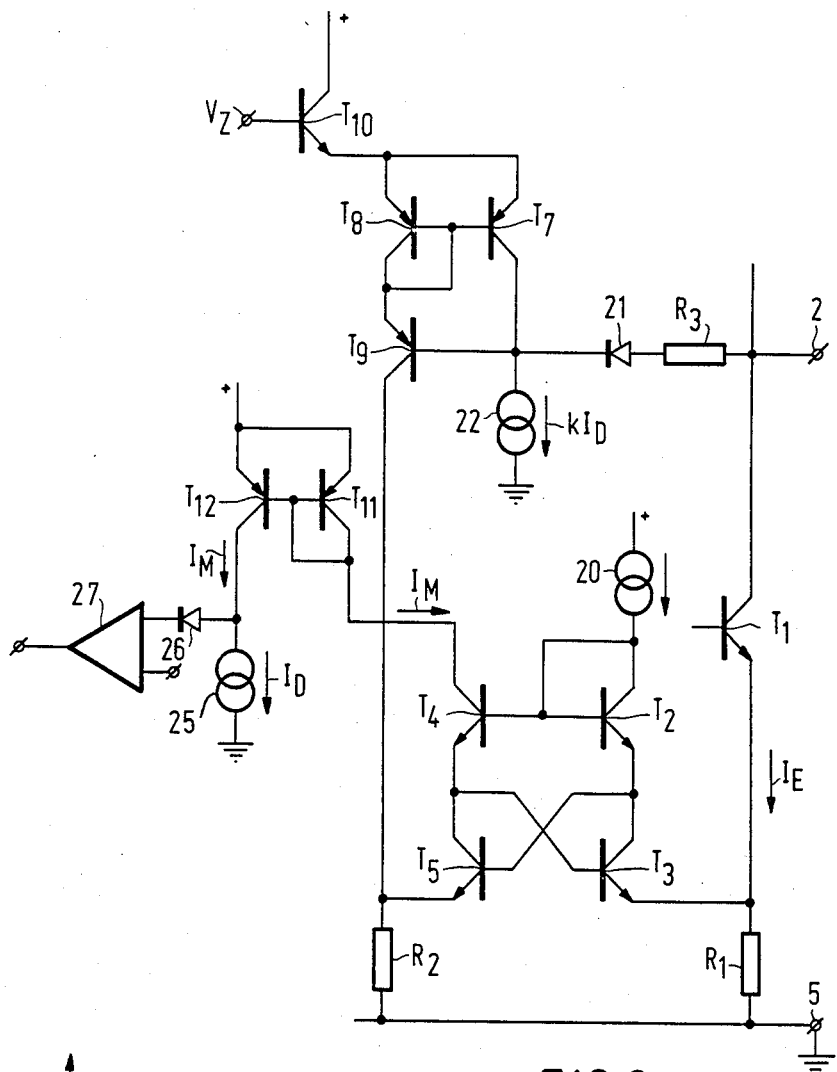
FIG. 3 shows the detailed construction of a particular protection circuit according to the invention.

A particular protection circuit will now be described in greater detail with reference to FIG. 3. Herein $T_1$ is again the transistor to be protected, whose collector is connected to the output 2 and whose emitter is connected to ground via a resistor $R_1$. The resistor $R_1$ forms part of a current mirror circuit forming the first voltage-current converter. The current mirror circuit comprises a first path, incorporating a current source 20, a diode-connected transistor $T_2$, a transistor $T_3$ and the resistor $R_1$ and a second path incorporating transistors $T_4$ and $T_5$ and resistor $R_2$. The transistors $T_2$ and $T_4$ have commonned bases, whilst the base of transistor $T_3$ is connected to the collector of transistor $T_5$ and the base of transistor $T_5$ is connected to the collector of transistor $T_3$. As the collector current of transistor $T_4$ is substantially equal to that of transistor $T_5$, and as the collector current of transistor $T_2$ is substantially equal to that of transistor $T_3$, the sum of the base-emitter voltages of transistors $T_3$ and $T_4$ is equal to the sum of those of transistors $T_2$ and $T_5$. The collector current of transistor $T_4$ is therefore such that the voltages across the resistors $R_1$ and $R_2$ are substantially equal. In response to the emitter current $I_E$ of transistor $T_1$ there will therefore flow in the collector circuit of transistor $T_4$, disregarding a setting direct current term due to current source 20, and disregarding the collector current of transistor $T_9$, a current which is equal to $$\frac{R_1}{R_2} \cdot I_E.$$

The direct current term is compensated for by an equally large term in the current carried by current source 25, which however plays no part in the operation of the protection and is consequently omitted from the further calculations.

The collector of transistor $T_1$ is coupled via a resistor $R_3$ and a diode 21 to the input of a current mirror formed by the transistors $T_7$, $T_8$ and $T_9$. In addition, a current source 22 carrying a current $kI_D$ is coupled to the input of the current mirror. The commonned emitters of the transistors $T_7$, $T_8$ are connected to the emitter of a transistor $T_{10}$, the base of which carries a reference voltage $V_Z$. The output current of the current mirror $T_7$, $T_8$, $T_9$ is applied to the resistor $R_2$.

The voltage at the cathode of diode 21 is substantially $V_Z - 3V_{BE}$, wherein the $V_{BE}$s are the base-emitter voltages of transistors $T_8$, $T_9$ and $T_{10}$. The diode 21 is therefore non-conductive for voltages at the output 2 less than $V_Z - 2V_{BE}$. In such a case the current applied to resistor $R_2$ from mirror $T_7$, $T_8$, $T_9$, is exactly equal to the current $kI_D$ carried by current source 22. The total collector current $I_M$ of transistor $T_4$ is then equal to $$I_M = \frac{R_1}{R_2} \cdot I_E - kI_D.$$

This current is now first reproduced with the aid of a current mirror comprising transistors $T_{11}$ and $T_{12}$ and thereafter compared with the current $I_D$ carried by a current source 25, which in this example is further coupled schematically for the sake of simplicity to a control amplifier 27 via a diode 26. If now the current $I_M$ becomes greater than the current $I_D$ then the protection circuit becomes operative and the control amplifier so controls the current $I_E$ through the output transistor $T_1$ that the current $I_M$ becomes equal to the current $I_D$. The current $I_E$ is thereby limited to the maximum value $$I_E \max = \frac{R_2}{R_1} (1 + k) I_D$$

For voltages at the output 2 higher than $V_Z - 2V_{BE}$ diode 21 starts to conduct, so that with increasing collector-emitter voltage a portion of the current $kI_D$ will flow through the resistor $R_3$. As a result thereof the limit value of the emitter current $I_E$ will decrease linearly with increasing collector-emitter voltages $V_{CE}$.

If the voltage at the output 2 reaches the value of the knee voltage $V_k = V_Z - 2V_{BE} + kI_D R_3$, then the current $kI_D$ carried by current source 22 flows completely through resistor $R_3$ and the current mirror $T_7$, $T_8$, $T_9$ becomes currentless. The current $I_M$ then becomes equal to $$I_M = \frac{R_1}{R_2} I_E,$$

so that the current $I_E$ is limited to a residual value equal to $$I_E = \frac{R_2}{R_1} \cdot I_D.$$

Figure 4:
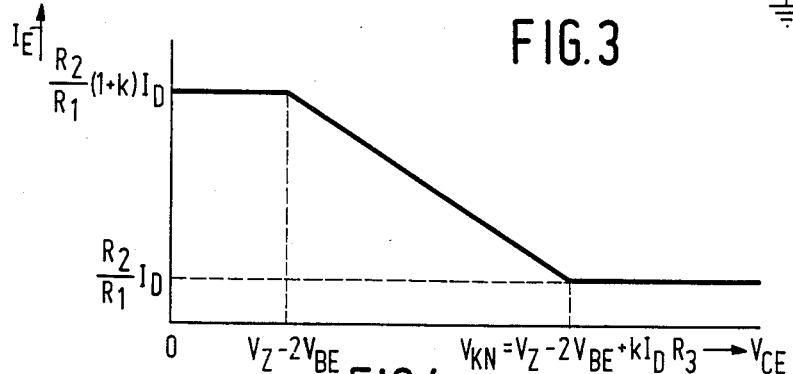
FIG. 4 shows the collector current-collector-emitter voltage characteristic associated with the circuit shown in FIG. 3.

For the sake of completeness FIG. 4 illustrates the associated $I_E - V_{CE}$ characteristic together with the characteristic values.

FIG. 5 shows an amplifier circuit provided with protection circuits according to the invention. The amplifier comprises a first stage 30 which evidences the character of a voltage-current converter and comprises a pair of transistors $T_{15}$ and $T_{16}$ which are connected as a differential amplifier and whose base electrodes constitute the inverting and the non-inverting inputs. The emitters of the transistors $T_{15}$ and $T_{16}$ are connected to the positive supply terminal 32 via a current source 31. The collectors of the transistors $T_{15}$, $T_{16}$ are connected to the output 36 of this stage 30 via a current mirror comprising $T_{17}$, $T_{18}$, $T_{19}$, resistors 33 and 34 and current source 35. The output 36 forms at the same time the input 36 of a Miller stage 40, which has the character of a current-voltage converter. The input 36 is further connected to output 2 via a compensation-capacitance 46. This stage 40 comprises a control transistor $T_{20}$ with emitter resistor 42, which is driven by means of the emitter follower configuration formed by transistor $T_{21}$ and current source 41 and whose collector is connected to the positive supply terminal 32 via the diodes 42, 43 and 44 and a current source 45. The output stage is constructed as a quasi-complementary output stage with NPN output transistors $T_1$ and $T_{25}$, which form Darlington transistors with NPN transistors $T_{26}$ and $T_{27}$ respectively. The quasi-complementary behaviour is obtained by adding the PNP transistors $T_{28}$ and $T_{29}$ as shown in the Figure. Output transistor $T_1$ is protected by a circuit 50 which is almost wholly identical to the protection circuit of FIG. 3 and in which corresponding components are given the same reference numerals.

Before it is compared with the current $I_D$ carried by current source 25, the current $I_M$ is reproduced with the aid of a current mirror comprising transistors $T_{30}$, $T_{31}$ and resistors 51 and 52. The difference between the currents $I_M$ and $I_D$ is applied to the series arrangement of a resistor 53 and capacitor 54. The voltage across this series arrangement is applied to resistor 55 via the amplifier $T_{32}$ which is connected as an emitter follower. With a view to driving transistor $T_1$, *the emitter current of transistor $T_{32}$* must still be inverted before presentation to the input 36 of the control stage. This is accomplished by connecting the resistor 55 to the input of the current mirror $T_{17}$, $T_{18}$, $T_{19}$, which causes that current mirror to invert the emitter current of transistor $T_{32}$ before presenting it to input 36.

In the protection circuit 50 the base of transistor $T_{32}$ is clamped with the aid of a transistor $T_{33}$ relative to a point which carries reference voltage $V_R$. This measure has for its object to prevent the protection circuit 50 from becoming active when there is no need for the protection to operate. The current $I_M$ is then smaller than the current $I_D$ carried by current source 25. The transistor $T_{33}$ is then kept in the conducting stage by the superfluous current from current source 25. The voltage $V_R$ is therefore such that transistor $T_{32}$ does not conduct when the protection is not active. Transistor $T_{33}$ is rendered non-conductive at the instant at which the protection becomes operative and transistor $T_{32}$ starts to conduct.

Output transistor $T_{25}$ is protected in a similar way by means of a circuit 50A, which corresponds to a large extent to circuit 50 and in which corresponding components are given the same reference numerals with the addition of the index A. The mode of operation of circuit 50A is the same as that of circuit 50, with the exception that the transistors of the current mirrors $T_{2A}$ to $T_{5A}$ and $T_{7A}$ to $T_{10A}$ are of the opposite conductivity types. As a result thereof the current $I_M$ must not first be inverted by a current mirror before it is applied to the base of transistor $T_{32A}$. In view of the complementary drive of transistor $T_{25}$ the resistor 55A is directly connected to the input 36 of the control amplifier $T_{20}$, $T_{21}$.

It will be obvious that the invention is not limited to the embodiments shown, but that many embodiments with which the desired functions can be realised are possible within the scope of the invention. Thus, a person skilled in the art will be able to conceive many variations for the first and second voltage-current converters and the variable gain amplifier.

What is claimed is:

1. Protection circuit for protecting a transistor having an emitter and a collector from overloading, comprising:

first means connected to said transistor for generating a first signal constituting a measure of the emitter current of said transistor;

second means connected to said transistor for generating a second signal having a constant value when said collector emitter voltage exceeds a predetermined voltage, said second signal constituting a measure of the difference between said predetermined voltage and said collector-emitter voltage of said transistor when said collector emitter voltage is less than said predetermined voltage; and third means connected to said first and second means for creating a difference signal corresponding to the difference between said first and second signals and for limiting said emitter current of said transistor when said difference signal exceeds a predetermined threshold value.

2. A protection circuit as claimed in claim 1, wherein said first voltage-current converter means comprises a first current mirror circuit having an input circuit comprising at least the series arrangement of a current source, a second transistor and said first resistor and an output circuit comprising at least the series arrangement of a third transistor and a second resistor, wherein said second voltage-current converter means comprises a second current mirror circuit having an input circuit comprising at least the series arrangement of a current source and a fourth transistor and an output circuit which comprises at least a fifth transistor, said input and output circuits having a common sixth transistor the control electrode of which carries a reference voltage, wherein said input circuit of said second current mirror circuit is further coupled via the series arrangement of a diode and a third resistor to a selected one of the collector and the emitter of the transistor to be protected, and wherein said output circuit of said second current mirror circuit is further coupled to said second resistor in said output circuit of said first current mirror circuit.

3. A protection circuit as claimed in claim 1, wherein said first means comprises a first resistor connected to a selected one of said collector and said emitter of said transistor, and first voltage-current converter means connected to said first resistor for converting the voltage there-across into a first current proportional thereto;

wherein said second means comprises second voltage-current converter means for converting the difference between said collector-emitter voltage and said predetermined voltage into a second current proportional to said difference, and wherein said third means comprises a current source for furnishing a threshold current, means for generating a difference current corresponding to the difference between said first and second currents, and means connected to said difference current generating means for limiting said emitter current so that said difference current is equal to said threshold current.

* * * * *